United States Patent
Seol et al.

(10) Patent No.: US 7,995,396 B2
(45) Date of Patent: Aug. 9, 2011

(54) METHODS OF OPERATING MEMORY DEVICES

(75) Inventors: Kwang-soo Seol, Yongin-si (KR); Sung-Il Park, Suwon-si (KR); Yoon-dong Park, Yongin-si (KR); Young-gu Jin, Hwaseong-si (KR); In-sung Joe, Seoul (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 99 days.

(21) Appl. No.: 12/458,294

(22) Filed: Jul. 8, 2009

(65) Prior Publication Data
US 2010/0008136 A1 Jan. 14, 2010

(30) Foreign Application Priority Data
Jul. 8, 2008 (KR) .................. 10-2008-0066221

(51) Int. Cl.
*G11C 11/34* (2006.01)
(52) U.S. Cl. ................. 365/185.2; 365/185.24
(58) Field of Classification Search ........... 365/185.2, 365/185.24
See application file for complete search history.

(56) References Cited

U.S. PATENT DOCUMENTS
2002/0159315 A1* 10/2002 Noguchi et al. ............ 365/200
2007/0133295 A1* 6/2007 Fong et al. ............... 365/185.21
2008/0298127 A1* 12/2008 Kim et al. ............... 365/185.17

FOREIGN PATENT DOCUMENTS
JP 2000-243094 9/2000
JP 2002-133888 5/2002
KR 10-2004-0036015 4/2004
KR 10-2007-0052403 5/2007

* cited by examiner

*Primary Examiner* — Michael T Tran
(74) *Attorney, Agent, or Firm* — Harness, Dickey & Pierce, PLC (57) ABSTRACT

Provided are methods of operating NAND nonvolatile memory devices. The operating methods include applying a read voltage or a verify voltage to a selected memory cell from among a plurality of memory cells of a cell string to verify or read a programmed state of the selected memory cell; applying a first pass voltage to non-selected memory cells closest to the selected memory cell of the cell string; applying a second pass voltage to second closest non-selected memory cells to the selected memory cell; and applying a third pass voltage to other non-selected memory cells, where the first pass voltage is less than each of the second and third pass voltages and the second pass voltage is greater than the third pass voltage.

20 Claims, 4 Drawing Sheets

METHODS OF OPERATING MEMORY DEVICES

PRIORITY STATEMENT

This application claims priority under 35 U.S.C. §119 to Korean Patent Application No. 10-2008-0066221, filed on Jul. 8, 2008, in the Korean Intellectual Property Office (KIPO), the entire contents of which is incorporated herein by reference.

BACKGROUND

1. Field

Example embodiments relate to methods of operating memory devices, and more particularly, to methods of operating NAND flash memory devices including reading or verifying a programmed state of a selected memory cell.

2. Description of the Related Art

Nonvolatile memory devices are storage devices that preserve stored data even when the supply of power is cut off. Floating gate flash memory devices, which are operated by storing electric charges in a floating gate formed of a conductor (e.g., polysilicon), have been commercialized as large capacity nonvolatile memory devices. A memory cell of a flash memory device may be classified into a single level cell (SLC) in which two states are recorded in one cell (e.g., "1" and "0") and a multi-level cell (MLC) in which four or more states are recorded in one cell (e.g., "11", "10", "01", and "00"). MLC technology is used to make large capacity NAND or NOR flash memory devices.

In order to determine a programmed state of a selected memory cell in a NAND flash memory device, a current path needs to be formed between a bit line BL and ground, through non-selected memory cells. A verify voltage $V_{verify}$ or a detect voltage $V_{reference}$ is applied to the selected memory cell to be verified or read and a pass voltage $V_{read}$ is applied to the non-selected memory cells. The pass voltage $V_{read}$ is used to enable the non-selected memory cells to be turned on irrespective of the programmed state of the non-selected memory cell. For example, during a read operation, about 0V may be applied to a word line WL to which the selected memory cell is connected, a pass voltage $V_{read}$ of about 6V may be applied to word lines to which the non-selected memory cells are connected, and a voltage of about 1V may be applied to the bit line BL.

When about 0V is applied to the word line WL to which the selected memory cell is connected, if the selected memory cell is in an erased state, a threshold voltage $V_{th}$ becomes a negative value. If the selected memory cell is an SLC, since a cell transistor is turned on, current begins to flow when the non-selected memory cells that are connected in series provide a current path. As a result, charges drain from the bit line BL that is pre-charged and the voltage of the bit line BL is reduced, making it possible for a sensing circuit to determine that the selected memory cell is in an erased state. If the selected memory cell, however, is in a programmed state, a threshold voltage $V_{th}$ becomes a positive value. Because the selected memory cell is turned off, charges may not drain from the bit line BL that is pre-charged and the voltage of the bit line BL is maintained, thereby making it possible for the sensing circuit to determine that the selected memory cell is in a programmed state.

The pass voltage $V_{read}$ is difficult to set due to the small margin in which it may be set. The pass voltage $V_{read}$ must be large enough to turn on a cell transistor and form a channel irrespective of the programmed state of each of the memory cells. If the pass voltage $V_{read}$ increases, a turn-on resistance of each of the memory cells decreases, which is desirable. However, a risk of gradually and undesirably programming the memory cell increases. For this reason, it is difficult to sufficiently increase the pass voltage $V_{read}$. Additionally, if the pass voltage $V_{read}$ is too low, programmed memory cells may not be sufficiently turned on. It is difficult to sufficiently increase or decrease the pass voltage $V_{read}$ due to these considerations. If the memory cell that is in the programmed state is an MLC that may program 2-bit data to have four states (e.g., 11, 10, 00, and 01), because a threshold voltage of the memory cell is maximally about 4V, the pass voltage $V_{read}$ is generally determined to be about 6V by adding a margin of about 2V to the maximum threshold voltage of the memory cell.

The verify voltage $V_{verify}$ or the detect voltage $V_{reference}$ is used to determine a programmed state or a programmed level of the selected memory cell. The verify voltage $V_{verify}$ is used to verify whether the selected memory cell is programmed to a desired programmed state during a program operation. The detect voltage $V_{reference}$ is used to detect to what programmed state of the selected memory cell is set after the program operation. In operation of an SLC, the verify voltage $V_{verify}$ or the detect voltage $V_{reference}$, is used to determine whether the selected memory cell is programmed to have a state 1 or 0, and may use about 0V in general. In operation of an MLC, the verify voltage $V_{verify}$ may be about 1V, 2V, or 3 V and the detect voltage $V_{reference}$ may be about 0.5V, 1.5V, or 2.5 V according to programmed states. If the MLC has states "11" (an erased state), "10", "00", and "01", in the order in which a threshold voltage increases, the detect voltage $V_{reference}$ of about 0.5 V may be used to determine whether the selected memory cell is programmed to have the state "11" or "10", and the detect voltage $V_{reference}$ of about 1.5 V may be used to determine whether the selected memory cell is programmed to have the state "10" or "00", and the detect voltage $V_{reference}$ of about 2.5 V may be used to determine whether the selected memory cell is programmed to have the state "00" or "01".

During a verify or read mode, the pass voltage $V_{read}$ applied to neighboring memory cells may affect the channel of the selected memory cell, thereby making it difficult to determine whether the selected memory cell is in a programmed state or in an erased state. Because a channel voltage of the selected memory cell increases as the pass voltage Vread applied to control gates of the neighboring memory cells increases, the selected memory cell that is programmed to have the state "0" may be read as having the state "1", thereby increasing the possibility of detecting an error bit. The phenomenon where the pass voltage $V_{read}$ applied to the neighboring memory cells affects to the channel of the selected memory cell may be referred to as a short-channel effect.

For explanatory purposes, it is assumed that each of the memory cells has a size of less than 32 nm. If a pass voltage $V_{read}$ of about 6V is applied to cells closest to the selected memory cell, a threshold voltage of the selected memory cell may be reduced below about 0V due to the pass voltage $V_{read}$ applied to the closet memory cells. As the size of each of the memory cells decreases, the threshold voltage of the selected memory cell may be shifted toward a more negative value. If the verify voltage $V_{verify}$ or the detect voltage $V_{reference}$ applied to the selected memory cell is about 0V, a programmed state of the selected memory cell may not be read, thereby failing to determine whether the selected memory cell is programmed to have the state "1" or "0". Instead, the programmed state of the selected memory cell may be read when the verify voltage $V_{verify}$ or the detect voltage $V_{reference}$ applied to the selected memory cell is a negative value, reduced from 0V by a decrement corresponding to the contribution of the closest memory cells. The threshold voltage of the selected memory cell decreases due to the closest memory cells.

However, it is difficult to apply a negative voltage to a control gate during the operation of the NAND flash memory device. In order to reduce the influence of the closest cells on the selected memory cell and avoid a negative verify voltage $V_{verify}$ or the detect voltage $V_{reference}$, the pass voltage $V_{read}$ must be less than about 6V during a verify or read mode.

SUMMARY

Example embodiments include methods of operating a NAND nonvolatile memory device to read or verify a programmed state of a selected memory cell with improved accuracy by reducing disturbances generated due to interference between a control gate and a channel.

According to example embodiments, a method of operating a NAND nonvolatile memory device for verifying or reading a programmed state of a selected memory cell is provided, the operating method including: applying a read voltage or a verify voltage to the selected memory cell from among a plurality of memory cells; applying a first pass voltage to non-selected memory cells closest to the selected memory cell; applying a second pass voltage to non-selected memory cells second closest to the selected memory cell, the second pass voltage greater than the first pass voltage; and applying a third pass voltage to non-selected memory cells other than the closest or second closest non-selected memory cells, the third pass voltage greater than the first pass voltage but less than the second pass voltage.

The first pass voltage may satisfy the formula (Vth(min)−Vdetermine)/2α>V'read>Vth(max)−αV"read, where V'read is the first pass voltage, V"read is the second pass voltage, ΔVth is a change in a threshold voltage of the selected memory cell due to interference between a control gate and a channel, and α is ΔVth/V'read. The selected memory cell may be one of a floating gate memory cell and a charge trap memory cell. The selected and non-selected memory cells may be included in a memory string, and two outermost end memory cells on each end of the memory cell string may always be non-selected memory cells. The four outermost memory cells may be dummy cells that do not store information. The memory cells may be included in a cell string, and two end memory cells, one at each end of the cell string, may be dummy cells that do not store information.

According to example embodiments, a method of operating a NAND nonvolatile memory device for verifying or reading a programmed state of a selected memory cell of a memory cell string including a plurality of memory cells is provided, the operating method including: applying the operating method described above to memory cells on a side of the selected memory cell having at least three adjacent non-selected memory cells; and applying a second operating method that is different than the method described above to memory cells on a side of the selected memory cell having fewer than three adjacent non-selected memory cells.

The second operating method may include applying a read voltage or a verify voltage to the selected memory cell that is a third memory cell from the end of the memory cell string; applying the second pass voltage to non-selected memory cells closest to the selected memory cell; and applying the third pass voltage to non-selected memory cells other than the closest non-selected memory cells. The two outermost memory cells on each end of the memory cell string may be dummy cells.

According to example embodiments a method of operating a NAND nonvolatile memory device for verifying or reading a programmed state of a selected memory cell adjacent to an end memory cell of a memory cell string including a plurality of memory cells, the operating method including: applying a read voltage or a verify voltage to the selected memory cell; applying a first pass voltage to non-selected memory cells closest to the selected memory cell; applying a second or third pass voltage to non-selected memory cells second closest to the selected memory cell, the second and third pass voltage being greater than the first pass voltage; and applying a third pass voltage to non-selected memory cells other than the closest or second closest non-selected memory cells, the third pass voltage greater than the first pass voltage but less than the second pass voltage.

BRIEF DESCRIPTION OF THE DRAWINGS

Example embodiments will be more clearly understood from the following brief description taken in conjunction with the accompanying drawings. FIGS. 1-5 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers, methods and/or sections, these elements, components, regions, layers and/or sections should not be limited by these terms. These terms are only used to distinguish one element, component, region, layer, method or section from another element, component, region, layer, method or section. Thus, a first element, component, region, layer, method or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
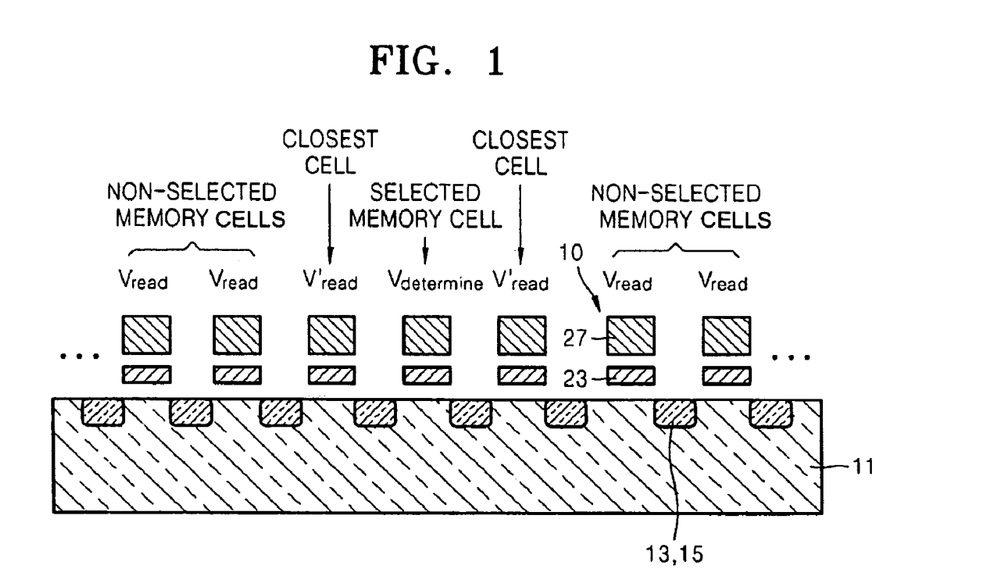
FIG. 1 is a cross-sectional diagram illustrating an example verify or read operation of a NAND nonvolatile memory device.

FIG. 1 is a cross-sectional diagram illustrating an example verify or read operation of a NAND nonvolatile memory device, where the cross section is taken in the direction of a bit line. In a NAND nonvolatile memory device (e.g., a NAND flash memory device) a plurality of memory cells each constituting a NAND string may include a selected memory cell to be verified or read and non-selected memory cells. The non-selected memory cells may be classified as closest memory cells to the selected memory cell, second closest memory cells to the selected memory cell, and other non-selected memory cells. During a verify or read operation, a determine voltage $V_{determine}$ may be applied to the selected memory cell. The determine voltage $V_{determine}$ may be either a verify voltage $V_{verify}$ applied to the selected memory cell for a verify operation or a read voltage $V_{reference}$ applied to the selected memory cell for a read operation.

A pass voltage $V'_{read}$ may be applied to the closest memory cells and a pass voltage $V_{read}$ may be applied to the other non-selected memory cells to verify or read a programmed state of the selected memory cell. The pass voltage $V'_{read}$ may be less than the pass voltage $V_{read}$ in order to reduce interference between a control gate and a channel. The pass voltage $V'_{read}$ applied to the closest cells may be less than the pass voltage $V_{read}$ applied to the other non-selected memory cells. A channel voltage $V_{channel}$ applied to the channel of the selected memory cell may be defined by Formula (1).

$$V_{channel} = V_{determine} + 2\alpha V'_{read} \qquad (1)$$

$V_{determine}$ may be either the verify voltage $V_{verify}$ or the read voltage $V_{reference}$, and a may be a coupling ratio between each of control gates of the closest memory cells and the channel of the selected memory cell. The coupling ratio $\alpha$ may be defined by $\alpha = \Delta V_{th}/V'_{read}$, where $\Delta V_{th}$ is a change in a threshold voltage $V_{th}$ of the selected memory cell due to an interference between the control gate and the channel. For example, if each of the memory cells has a size of about 32 nm, the coupling ratio $\alpha$ may be about 0.05. If each of the memory cells has a size of about 24 nm, the coupling ratio $\alpha$ may be about 0.13.

A channel voltage $V'_{channel}$ of each of the closest memory cells may be also affected by neighboring memory cells. The channel voltage $V'_{channel}$ of each of the closest memory cells may be defined by Formula (2).

$$V'_{channel} = V'_{read} + \alpha V_{read} \qquad (2)$$

Figure 2:
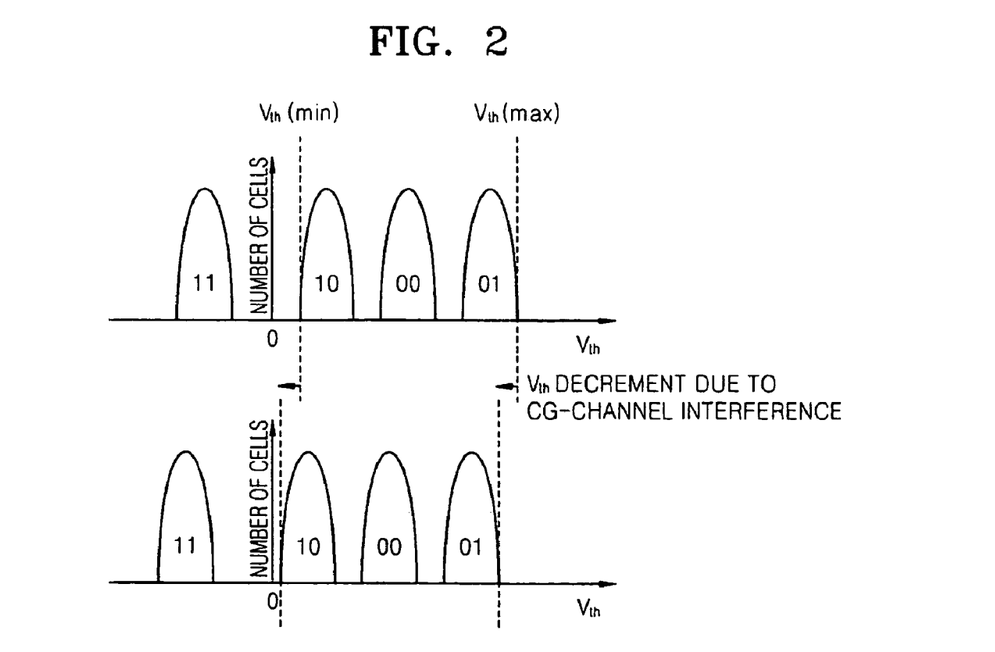
FIG. 2 shows two graphs, each graph illustrating a distribution of threshold voltages for four states in a NAND flash memory device including 2-bit data memory cells.

FIG. 2 shows two graphs, each graph illustrating a distribution of threshold voltages for four states in a NAND flash memory device including 2-bit data memory cells. In FIG. 2, a state '11' may be an erased state, and states '10', '00', and '01' may be programmed states. Since the state '11' is a data state of the 2-bit data, the state '11' may also be considered as a programmed state. For convenience, the state '11' may be referred to as a programmed state as necessary. A threshold voltage of the state '11' may be a negative value and threshold voltages of the states '10', '00', and '01' may be positive values. Although the threshold voltages of the programmed states '10', '00', and '01' may be in ascending order, example embodiments are not limited thereto, and the order of threshold voltages of the programmed states '10', '00', and '01' may be changed.

In FIG. 2, a $V_{th}$(min) and $V_{th}$(max) may denote a minimum threshold voltage and a maximum threshold voltage, respectively. When the threshold voltages of the programmed states '10', '00', and '01' are in ascending order, the minimum threshold voltage $V_{th}$(min) may be the minimum threshold voltage of the state '10' and the maximum threshold voltage $V_{th}$(max) may be the maximum threshold voltage of the state '01'.

Referring to FIG. 2, the upper graph may illustrate the threshold voltage distribution of each of the states 11, 10, 00, and 01, when there is no CG-channel interference between the selected memory cell and each of the closest memory cells. The lower graph may illustrate the threshold voltage distribution of each of the states 11, 10, 00, and 01 with CG-channel interference between the selected memory cell and each of the closest memory cells. The threshold voltage $V_{th}$ of the selected memory cell may be decremented due to control gate to channel (CG-channel) interference between the selected memory cell and each of the closest memory cells. As shown in the lower graph of FIG. 2, the threshold voltage distribution of each of the states 11, 10, 00, and 01 may be moved toward a lower threshold voltage.

If the decrement by which the threshold voltage of the selected memory cell is reduced due to the CG-channel interference between the selected memory cell and each of the closest memory cells is greater than the minimum threshold voltage $V_{th}$(min), both the state '11' and the state '10' may need to be determined by using a negative verify voltage $V_{verify}$ or a negative read voltage $V_{reference}$. If the decrement is greater than the minimum threshold voltage $V_{th}$(min), the minimum threshold voltage $V_{th}$(min) of the state '10' may become a negative value. If the decrement is greater than the minimum threshold voltage $V_{th}$(min), it may be difficult to operate the NAND nonvolatile memory device if there is no negative power source. A 2-bit memory cell may not be realized. For this reason, the minimum threshold voltage $V_{th}$(min) may need to be greater than the channel voltage $V_{channel}$ of the selected memory cell as defined by Formula (3).

$$V_{th}(\min)-V_{channel}>0 \quad (3)$$

The condition of Formula (3) may be incorporated into Formula (1) to produce Formula 4.

$$(V_{th}(\min)-V_{determine})/2\alpha>V'_{read} \quad (4)$$

In Formula (4), $V_{determine}$ may be a read voltage $V_{reference}$ or a verify voltage $V_{verify}$. For a read or verify operation in a NAND string, the pass voltage $V'_{read}$ may need to be applied to the closest memory cells so that the closest memory cells may be turned on irrespective of the programmed state of the selected memory cell. The channel voltage $V'_{channel}$ of each of the closest memory cells may need to be greater than the maximum threshold voltage $V_{th}$(max) as defined by Formula (5).

$$V'_{channel}>V_{th}(\max) \quad (5)$$

The condition of Formula (5) may be incorporated into Formula (2) to produce Formula (6).

$$V'_{read}>V_{th}(\max)-\alpha V_{read} \quad (6)$$

The formulae for the selected memory cell and the closest memory cells may be combined so that a range of the voltage $V'_{read}$ (pass voltage of the closest memory cells) satisfies conditions applied to both the selected memory cell and the closest memory cell. Formulae 4 and 6 may be combined to produce Formula (7).

$$(V_{th}(\min)-V_{determine})/2\alpha>V'_{read}>V_{th}(\max)-\alpha V_{read} \quad (7)$$

An example application of the above formulae will now be described. If each of the memory cells of the NAND flash memory device is an MLC having four levels, the minimum threshold voltage $V_{th}$(min) may be, for example, about 0.5V and the maximum threshold voltage $V_{th}$(max) may be, for example, about 4V. The pass voltage $V_{read}$ may be, for example, about 6V. The coupling ratio α may be, for example, about 0.05 when each of the memory cells has a size of about 32 nm. If a voltage of about 0V is used as the determine voltage $V_{determine}$ in Formula 7, in order to distinguish the state '11' and the state '10', the pass voltage $V'_{read}$ may be in the range of about $5V>V'_{read}>3.7V$. According to another example application, the coupling ratio α may be, for example, about 0.13 when each of the memory cells has a size of about 24 nm. If a voltage of about 0V is used as the determine voltage $V_{determine}$ in Formula 7, the left side ($V_{th}$(min)-$V_{determine}$)/2α may be about 2V and the right side $V_{th}$(max)-α$V_{read}$ may be about 3.2V. Because the right side is greater than the left side, it may be determined that no pass voltage $V'_{read}$ satisfying Formula 7 exists.

Although the pass voltage $V'_{read}$ applied to the closest memory cells needs to be reduced as much as possible to reduce CG-channel interference, the pass voltage $V'_{read}$ may be reduced below a minimum voltage necessary for maintaining the turn-on states of the closest memory cells, thereby failing to both minimize and/or reduce the CG-channel interference and maintain the turn-on states of the closest memory cells. When each of the memory cells of the NAND flash memory device has a size of less than about 24 nm it may be difficult and/or impossible to find the voltage $V'_{read}$ permitting the operation of the NAND flash memory device.

Methods of operating NAND nonvolatile memory devices according to example embodiments may be applied to a highly integrated NAND flash memory device using a design rule for a memory cell size of less than about 30 nm. The pass voltage $V'_{read}$ applied to the closest memory cells may be reduced so that the CG-channel interference during the verify or read operation may be reduced, and the read or verify operation may be normally performed so that the turn-on states of the closest memory cells may be maintained.

In order to satisfy Formula 7 such that a pass voltage $V'_{read}$ satisfying Formula 7 exists, the right side of Formula 7 may be reduced. In order to reduce the right side of Formula 7, α$V_{read}$ may be increased. As described above, the pass voltage $V_{read}$ may be about 6V. If the pass voltage $V_{read}$ is greater than about 6V, the right side of Formula 7 may be reduced. However, the pass voltage $V_{read}$ applied to the other non-selected memory cells except the closest memory cells may be increased, a high voltage may be applied to all the non-selected memory cells during a read operation, and a possibility that the non-selected memory cells may be soft-programmed (e.g., the states of the non-selected memory cells may be changed) is high and or increased.

In order to maintain the turn-on states of the closest memory cells while reducing the CG-channel interference with reduced risk that the non-selected memory cells may be soft-programmed, a determine voltage $V_{determine}$ (e.g., a verify voltage $V_{verify}$ or a read voltage $V_{reference}$) may be applied to the selected memory cell, a first pass voltage $V'_{read}$ may be applied to the closest non-selected memory cells to the selected memory cell, a second pass voltage $V''_{read}$ may be applied to second closest non-selected memory cells, and a third pass voltage $V_{read}$ may be applied to the other non-selected memory cells. The second pass voltage $V''_{read}$ may be grater than the third pass voltage $V_{read}$.

Figure 3:
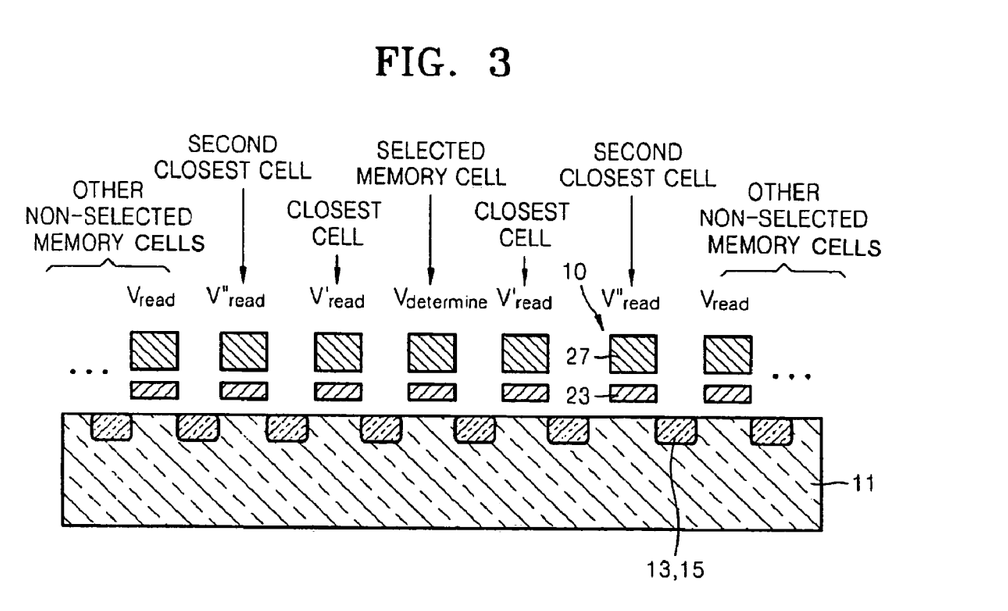
FIG. 3 is a cross-sectional diagram illustrating a verify or read operation in a NAND flash memory device according to example embodiments.

FIG. 3 is a cross-sectional diagram illustrating a verify or read operation in a NAND flash memory device according to example embodiments. Referring to FIG. 3, during a verify or read operation, the determine voltage $V_{determine}$ (e.g., the verify voltage $V_{verify}$ or the read voltage $V_{reference}$) may be applied to the selected memory cell, the first pass voltage $V'_{read}$ may be applied to the closest non-selected memory cells to the selected memory cell, the second pass voltage $V''_{read}$ may be applied to the second closest non-selected memory cells, and a third pass voltage $V_{read}$ may be applied to the other non-selected memory cells. The first pass voltage $V'_{read}$ may be less than each of the second and third pass voltages $V''_{read}$ and $V_{read}$, and the second pass voltage $V''_{read}$ may be greater than the third pass voltage $V_{read}$. The third pass voltage $V_{read}$ may be about 6V.

According to operating methods of example embodiments, Formula 8 may be derived from Formula 7 by substituting the second pass voltage $V''_{read}$ for the pass voltage $V_{read}$ of Formula 7.

$$(V_{th}(\min) - V_{determine})/2\alpha > V'_{read} > V_{th}(\max) - \alpha V''_{read} \quad (8)$$

An example application of Formula (8) will now be described. If each of the memory cells has a size of about 24 nm and the determine voltage $V_{determine}$ is about 0V, the first pass voltage $V'_{read}$ of the closest non-selected memory cells with respect to the minimum threshold voltage $V_{th}(\min)$ and the maximum threshold voltage $V_{th}(\max)$ which is obtained by using Formula 8 may be shown as in Table 1.

TABLE 1

| Vth (min) | Vth (max) | Vth(min)/ 2alpha | Vth(max)-αV″read ||||
|---|---|---|---|---|---|---|
| | | | (V″ = 6 V) | (V″ = 7 V) | (V″ = 8 V) | (V″ = 10 V) |
| 0.5 | 4 | 2.3 | 3.34 | 3.23 | 3.12 | 2.9 |
| 0.55 | 4.05 | 2.5 | 3.39 | 3.28 | 3.17 | 2.95 |
| 0.6 | 4.1 | 2.7 | 3.44 | 3.33 | 3.22 | 3 |
| 0.65 | 4.15 | 3.0 | 3.49 | 3.38 | 3.27 | 3.05 |
| 0.7 | 4.2 | 3.2 | 3.54 | 3.43 | 3.32 | 3.1 |
| 0.75 | 4.25 | 3.4 | 3.59 | 3.48 | 3.37 | 3.15 |
| 0.8 | 4.3 | 3.6 | 3.64 | 3.53 | 3.42 | 3.2 |
| 0.85 | 4.35 | 3.9 | 3.69 | 3.58 | 3.47 | 3.25 |
| 0.9 | 4.4 | 4.1 | 3.74 | 3.63 | 3.52 | 3.3 |

Table 1 may be obtained by substituting the determine voltage $V_{determine}$ of about 0V, the minimum threshold voltage $V_{th}(\min)$, and the maximum threshold voltage $V_{th}(\max)$ into Formula 8. A marked region of Table 1 may show allowable values of the lower limit of the range of the first pass voltage $V'_{read}$ when the second pass voltage $V''_{read}$ applied to the second closest non-selected memory cells changes from about 6V to about 10V (e.g., values that satisfy Formula (8)). Table 1 may be obtained based on the premise that a memory window $V_{th}(\max)-V_{th}(\min)$ necessary to store data in a 4-level cell is kept constant. In order to distinguishably form 4 levels in a selected memory window, the memory window according to an operating method of example embodiments may need to be equal to or greater than that of a related NAND flash memory device.

Referring to Table 1, as the second pass voltage $V''_{read}$ applied to the second closest non-selected memory cells increases, the first pass voltage $V'_{read}$ may exist in a wider range than that when the same pass voltage is applied to the non-selected memory cells except the closest non-selected memory cells. For example, when the second pass voltage $V''_{read}$ and the third pass voltage $V_{read}$ are equally about 6V ($V''_{read}=V_{read}$=about 6V). If the second pass voltage $V''_{read}$ is about 6V and the third voltage $V_{read}$ is about 6V, the minimum threshold voltage $V_{th}(\min)$ may be about 0.85V and the maximum threshold voltage $V_{th}(\max)$ may be about 4.35V in order that the first pass voltage $V'_{read}$ necessary for a normal read or verify operation may range from about 3.9V to about 3.69V. In contrast, if the second pass voltage $V''_{read}$ is about 10V, the minimum threshold voltage $V_{th}(\min)$ may be about 0.85V and the maximum threshold voltage $V_{th}(\max)$ may be about 4.35V in order that the first pass voltage $V'_{read}$ necessary for a normal read or verify operation may range from about 3.9V to about 3.25V.

Referring to Table 1, if the second pass voltage $V''_{read}$ is about 10V, a detectable memory window range corresponding to an existing pass voltage $V'_{read}$ range may be in a range from about 0.70V to about 4.40V. In contrast, if the second pass voltage $V''_{read}$ is about 6V, the detectable memory window range corresponding to a range of the first pass voltage $V'_{read}$ may be in a range from about 0.85V to about 4.40V, which is narrower by approximately 0.15V than that when the second pass voltage $V''_{read}$ is about 10V. If the second pass voltage $V''_{read}$ applied to the second closest memory cells is greater than the third pass voltage $V_{read}$ applied to the other non-selected memory cells, a range of a detectable memory window may be increased.

If the first pass voltage $V'_{read}$ is about 3.25V, the allowed minimum threshold voltage $V_{th}(\min)$ may be about 0.75V as seen in Table 1. If the first pass voltage $V'_{read}$ is about 3.25V and the second pass voltage $V''_{read}$ is about 10V, the detectable memory window may range from about 0.75V to about 4.35V. In contrast, if the first pass voltage $V'_{read}$ is about 3.25V and the second pass voltage $V''_{read}$ is about 6V, a detectable memory window may not exist. If the first pass voltage $V'_{read}$ applied to the closest non-selected memory cells is about 3.25V and the second pass voltage $V''_{read}$ is about 6V, a programmed state of the selected memory cell may not be verified or read out.

When the first pass voltage $V'_{read}$ applied to the closest non-selected memory cells to the selected memory cell is less than the third pass voltage $V_{read}$ and the second pass voltage $V''_{read}$ applied to the second closest non-selected memory cells is greater than the third pass voltage $V_{read}$ applied to the other non-selected memory cells, the detectable memory window may be in a wider range. The wider range may ensure and/or increase the stability of a read or verify operation over a case where the same pass voltage ($V''_{read}=V_{read}$) is applied to all the non-selected memory cells except the closest non-selected memory cells.

Figure 4:
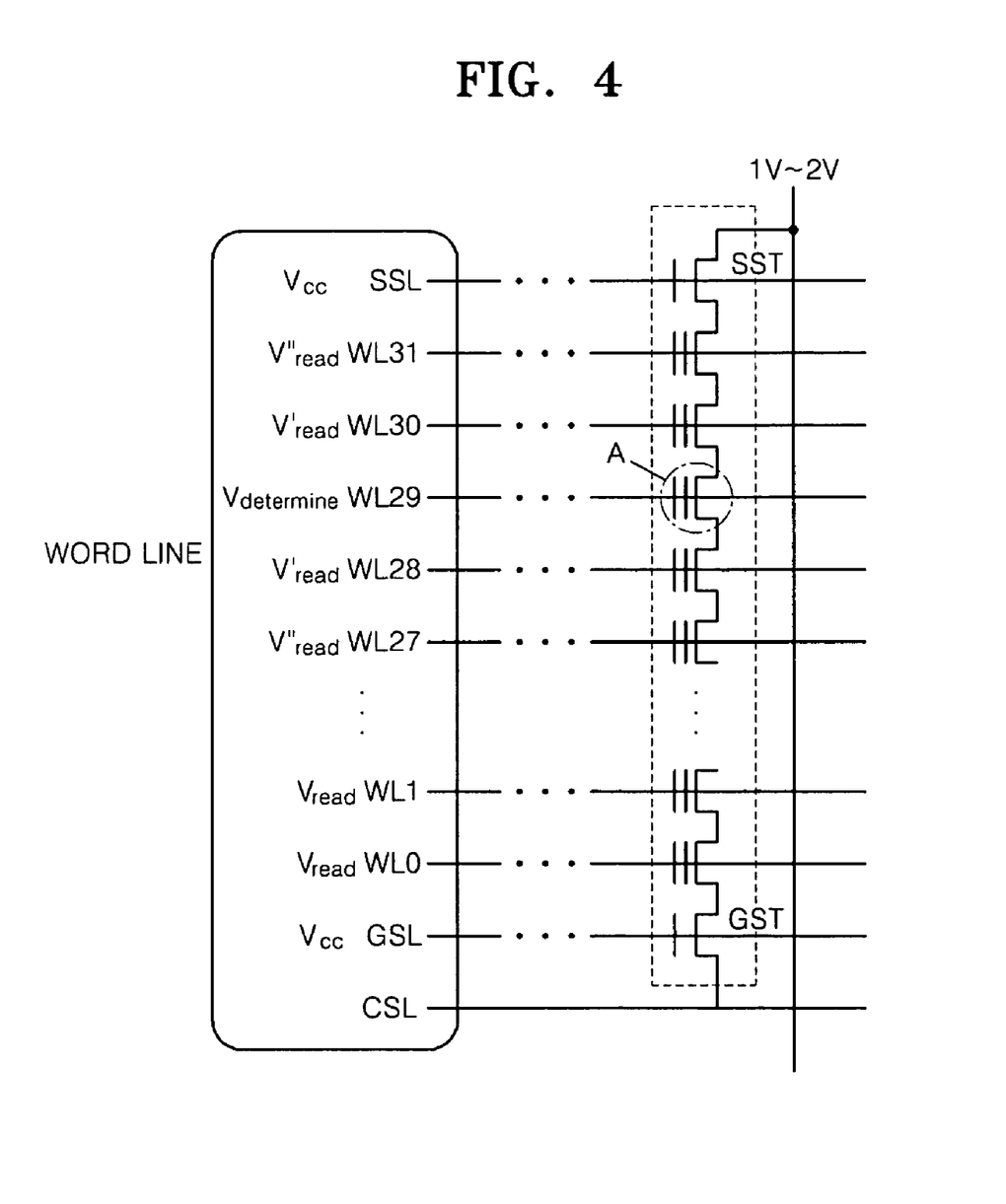
FIG. 4 is a circuit diagram of a string in a NAND flash memory device illustrating methods of operating a NAND flash memory device according to example embodiments.

FIG. 4 is a circuit diagram of a string in a NAND flash memory device illustrating methods of operating a NAND flash memory device according to example embodiments. Referring to FIG. 4, a NAND flash memory device may include a plurality of cell strings. In FIG. 4, one cell string connected to a bit line is shown as an example. Each of the plurality of cell strings may include a plurality of memory cells that share sources/drains with neighboring memory cells. Each of the memory cells of each of the cell strings may be, for example, a charge trap memory cell or a floating gate memory cell.

A ground selection transistor GST, a plurality of memory cells, and a string selection transistor SST may be serially connected in a cell string. One end of the cell string may be connected to a bit line and the other end of the cell string may be connected to a common source line CSL. The ground selection transistor GST may be connected to the common source line CSL, and the string selection transistor SST may be connected to the bit line. In a direction crossing the cell string, word lines WL may be connected to control gates of the plurality of memory cells, a string selection line SSL may be connected to a gate of the string selection transistor SST, and a ground selection line GSL may be connected to a gate of the ground selection transistor GST.

During a verify or read operation, a verify voltage $V_{verify}$ or a read voltage $V_{reference}$ of about 0V or higher may be applied to a word line to which a selected memory cell A is connected, for example, a word line WL29. A pass voltages may be applied to other word lines to which non-selected memory cells are connected. A first pass voltage $V'_{read}$ may be applied to word lines WL28 and WL30, which are the closest non-selected memory cells connected to the selected memory cell. A second pass voltage $V''_{read}$ may be applied to word lines WL27 and WL31, which are the second closest non-selected memory cells connected to the selected memory cell. A third pass voltage $V_{read}$ may be applied to other word lines WL0 through WL26 to which other non-selected memory cells are connected. A power voltage Vcc may be applied to the string selection line SSL and the ground selection line GSL. A voltage of greater than about 0V (e.g., about 1V to 2V) may be applied to the bit line.

According to example embodiments of methods of operating memory devices, two memory cells at each end of the cell string may be used as dummy cells. For example, during a process of verifying or reading a programmed state of the memory cell connected to the word line WL2, the memory cells connected to the word lines WL0 and WL1 may be provided with the third pass voltage $V_{read}$ and the second pass voltage $V''_{read}$, respectively, and may be used only as dummy cells that do not store information. During a process of verifying or reading a programmed state of the memory cell connected to the word line WL29, the memory cells connected to the word lines WL30 and WL31 may be supplied with the second pass voltage $V''_{read}$ and the third pass voltage $V_{read}$, respectively, and may be used only as dummy cells that do not store information.

A modification of operating methods according to example embodiments described above may be applied to the two memory cells at each end of the cell string if the four memory cells are not dummy cells. For example, when the cell string includes a NAND array of 32 memory cells connected to the word lines WL0 through WL31, operating methods according to example embodiments where two or more memory cells are connected on either side of the selected memory cell may be applied to the memory cells connected to the word lines WL2 through WK29.

In order to verify or read a programmed state of the memory cell connected to the word line WL1, the first pass voltage $V'_{read}$ may be applied to the memory cells connected to the word lines WL2 and WL0, the second pass voltage $V''_{read}$ or the third pass voltage $V_{read}$ may be applied to the memory cell connected to the word line WL3, and the third pass voltage $V_{read}$ may be applied to the memory cells connected to the word lines WL4 through WL31. In order to verify or read a programmed state of the memory cell connected to the word line WL0, the first pass voltage $V'_{read}$ may be applied to the memory cell connected to the word lines WL1, the second pass voltage $V''_{read}$ may be applied to the memory cell connected to the word line WL2, and the third pass voltage $V_{read}$ may be applied to the memory cells connected to the word lines WL3 through WL31.

In order to verify or read a programmed state of the memory cell connected to the word line WL30, the same and/or similar operating method as that applied to the memory cells connected to the word line WL1 may be used. In order to verify or read a programmed state of the memory cell connected to the word line WL31, the same and/or similar operating method as that applied to the memory cell connected to the word line WL0 may be used.

According to example embodiments, only one memory cell at each end of the cell string may be used as a dummy cell. For example, when the cell string includes a NAND array of 32 memory cells connected to the word lines WL0 through WL31, operating methods according example embodiments where two or more memory cells are connected on either side of the selected memory cell may be applied to the memory cells connected to the word lines WL2 through WL29. In order to verify or read a programmed state of the memory cell connected to the word line WL1, the first pass voltage $V'_{read}$ may be applied to the memory cells connected to the word lines WL2 and WL0, the second pass voltage $V''_{read}$ may be applied to the memory cell connected to the word line WL3, and the third pass voltage Vread may be applied to the memory cells connected to the word lines WL4 through WL31. In order to verify or read a programmed state of the memory cell connected to the word line WL30, the same and/or similar operating method as that applied to the memory cell connected to the word line WL1 may be used. The memory cells connected to the word lines WL31 and WL0 may be dummy cells that do not store information.

As described above, one or two memory cells at each of both the ends of the cell string may be used as dummy cells and/or a modified operating method according to example embodiments where two or more memory cells are connected on either side of the selected memory cell may be applied to the first and second memory cells at each end of the cell string to verify or read a programmed state. When one or two memory cells at each of the ends of the cell string are used as dummy cells, the number of memory cells included in the cell string may be determined by considering the dummy cells.

Figure 5:
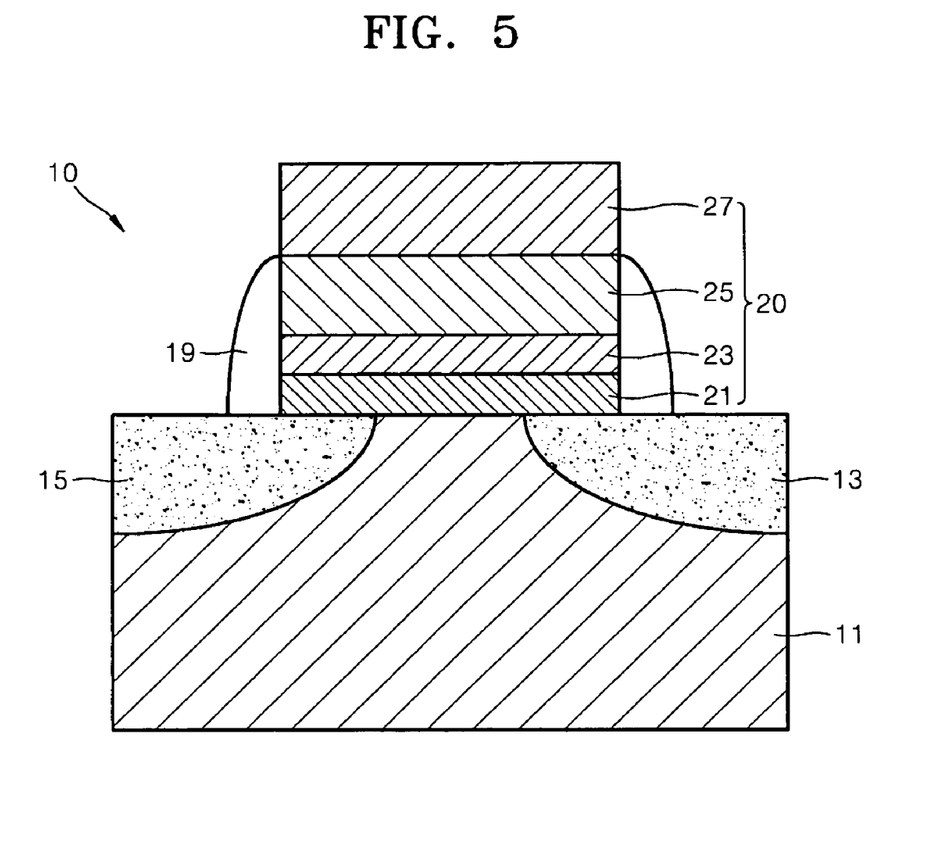
FIG. 5 is a cross-sectional view of a memory cell of a NAND flash memory device according to example embodiments.

FIG. 5 is a cross-sectional view of a memory cell 10 of a NAND flash memory device according to example embodiments. For example, the memory cell in FIG. 5 may be used as a memory cell 10 of the NAND nonvolatile memory device of FIG. 3 and/or FIG. 4. Referring to FIG. 5, the memory cell 10 may include a bulk region 11 and a gate structure 20 on the bulk region 11. First and second impurity regions 13 and 15 may be doped with conductive impurities and may be in the bulk region 11. For example, the bulk region 11 may include a p-well (not shown) doped with p-type impurities. The first and second impurity regions 13 and 15 may be in the p-well. One of the first and second impurity regions 13 and 15 may be used as a drain region and the other may be used as a source region.

The gate structure 20 may include a tunneling insulating layer 21 on the bulk region 11, a charge storage layer 23 on the tunneling insulating layer 21, a blocking insulating layer 25 on the charge storage layer 23, and a control gate 27 may be on the blocking insulating layer 25. Reference numeral 19 may denote spacers. The tunneling insulating layer 21 may be a charge tunneling layer. The first and second impurity regions 13 and 15 may be electrically coupled to the tunneling insulating layer 21.

The tunneling insulating layer 21 may be a tunneling oxide layer of, for example, SiO2, various high-k dielectrics, or a combination thereof. The tunneling insulating layer 21 may be, for example, a silicon nitride layer (e.g., $Si_3N_4$) having an impurity concentration not higher than that of the silicon oxide layer and having good interfacial properties with silicon. The tunneling insulating layer 21 may have a double-layer structure including a silicon nitride layer and an oxide layer. The tunneling insulating layer 21 may have a single layer structure formed of the oxide layer or the nitride layer or may have a multi-layer structure formed of materials having different energy band gaps.

The charge storage layer 23 may store information by charge trapping and may be a charge trap layer. For example, the charge storage layer 23 may include any one of a nitride, a high-k dielectric material having high permittivity, and nanodots, in order to act as a charge trap layer. For example, the charge storage layer 23 may be a nitride (e.g., Si3N4) and/or a high-k dielectric (e.g., HfO2, ZrO2, Al2O3, HfSiON, HfON, and/or HfAlO). The charge storage layer 23 may include a plurality of discontinuously arranged nanodots as a charge trap site and the nanodots may be nanocrystals. When the charge storage layer 23 acts as a charge trap layer, the memory cell 10 may be a charge trap memory cell. The charge storage layer 23 may be formed of polysilicon and the memory cell 10 may be a floating gate memory cell.

The blocking insulating layer 25 may prevent or reduce the number of charges that pass through the charge storage layer 23, and may be, for example, an oxide layer. The blocking insulating layer 25 may be formed of $SiO_2$ and/or a high-k material having a permittivity higher than that of the tunneling insulating layer 21 (e.g., $Si_3N_4$, $Al_2O_3$, $HfO_2$, $Ta_2O_5$, or $ZrO_2$). The blocking insulating layer 25 may have a multi-layer structure including an insulating layer of a general insulating material (e.g., SiO2) and a high k dielectric layer formed of a material having a permittivity higher than that of the tunnel insulating layer 21.

The control gate 27 may be a metal layer (e.g., Al, Ru or TaN, or a silicide material, for example, NiSi). When electrons are injected into the flash memory cell 10, the injected electrons may be stored in the charge storage layer 23, thereby changing a threshold voltage. Although the flash memory cell 10 of FIG. 5 is shown as a top gate flash memory cell in which the control gate is 27 is located on the top, a memory cell of a NAND nonvolatile memory device according to example embodiments is not limited thereto. A bottom gate flash memory cell in which the control gate 27 is located on the bottom may be used.

FIGS. 1 and 3 are cross-sectional diagrams illustrating a verify or read operation in a NAND flash memory device, the cross-section taken along the direction of a bit line. Referring to FIGS. 1 and 3, a plurality of memory cells 10 may be on the bulk region 11 and may constitute a NAND cell string. The source and drain regions 13 and 15 may be shared by neighboring memory cells that are serially connected in one cell string. The source and drain regions 13 and 15 may be in the bulk region 11. For simplicity, in FIGS. 1 and 3, only the charge storage layer 23 and the control gate 27 are illustrated for each of the memory cells. The tunneling insulating layer 21 between the bulk region 11 and the charge storage layer 23, and the blocking insulating layer 25 between the charge storage layer 23 and the control gate 27, are shown as empty spaces.

During a verify or read operation, a bit line voltage of about 1V to about 2V may be applied to the drain region and if a memory cell 10 is a selected memory cell, the determine voltage $V_{determine}$ may be applied to the control gate 27 of the memory cell 10. If the memory cell 10 is a non-selected memory cell, a pass voltage, for example, $V'_{read}$, $V''_{read}$, or $V_{read}$, may be applied to the control gate 27 of the memory cell 10.

The NAND flash memory device may be configured to perform an erase operation by units of blocks. One block may include a plurality of strings, for example, a plurality of the string shown in FIG. 4. If an erase operation is performed by units of blocks, an array of memory cells may be in a p-well that is in an n-well of a semiconductor substrate, and the source and drain regions 13 and 15 may be shared by neighboring memory cells that are serially connected in one cell string. When the block is limited to the p-well and the n-well, the bulk region 11 illustrated in FIGS. 1, 3, and 5 may correspond to the p-well.

Operating methods according to example embodiments may reduce disturbances generated due to interference between an adjacent control gate and a channel, and may improve the accuracy of reading or verifying a programmed state of a selected memory cell. While example embodiments have been particularly shown and described, it will be understood by one of ordinary skill in the art that variations in form and detail may be made therein without departing from the spirit and scope of the claims.

What is claimed is:

1. A first method of operating a NAND nonvolatile memory device for verifying or reading a programmed state of a selected memory cell, the operating method comprising:
   applying a read voltage or a verify voltage to the selected memory cell from among a plurality of memory cells;
   applying a first pass voltage to non-selected memory cells closest to the selected memory cell;
   applying a second pass voltage to non-selected memory cells second closest to the selected memory cell, the second pass voltage greater than the first pass voltage; and
   applying a third pass voltage to non-selected memory cells other than the closest or second closest non-selected memory cells, the third pass voltage greater than the first pass voltage but less than the second pass voltage.

2. The first operating method of claim 1, wherein the first pass voltage satisfies $(V_{th}(min)-V_{determine})/2\alpha > V'_{read} > V_{th}(max) - \alpha V''_{read}$, where $V'_{read}$ is the first pass voltage, $V''_{read}$ is the second pass voltage, $V_{th}(min)$ and $V_{th}(max)$ are a minimum threshold voltage and a maximum threshold voltage of the programmed state of the selected memory cell respectively, the read or verify voltage is $V_{determine}$, $\Delta V_{th}$ is a change in a threshold voltage of the selected memory cell due to interference between a control gate and a channel, and $\alpha$ is $\Delta V_{th}/V'_{read}$.

3. The first operating method of claim 2, wherein the selected memory cell is one of a floating gate memory cell and a charge trap memory cell.

4. The first operating method of claim 1, wherein the selected memory cell is one of a floating gate memory cell and a charge trap memory cell.

5. The first operating method of claim 1, wherein the non-selected memory cells are part of a memory cell string, and
   outermost end memory cells on each end of the memory cell string are always non-selected dummy cells that do not store information.

6. The first operating method of claim 1, wherein the non-selected memory cells are part of a memory cell string, and two outermost end memory cells on each end of the memory cell string are always non-selected memory cells.

7. The first operating method of claim 6, wherein the four outermost memory cells are dummy cells that do not store information.

8. A method of operating a NAND nonvolatile memory device for verifying or reading a programmed state of a selected memory cell of a memory cell string including a plurality of memory cells, the operating method comprising:
applying the operating method of claim 1 to memory cells on a side of the selected memory cell having at least three adjacent non-selected memory cells; and
applying a second operating method that is different than the first operating method to memory cells on a side of the selected memory cell having fewer than three adjacent non-selected memory cells.

9. The operating method of claim 8, wherein the second operating method includes applying a read voltage or a verify voltage to the selected memory cell that is a third memory cell from the end of the memory cell string;
applying the second pass voltage to non-selected memory cells closest to the selected memory cell; and
applying the third pass voltage to non-selected memory cells other than the closest non-selected memory cells.

10. The operating method of claim 9, wherein two outermost memory cells on each end of the memory cell string are dummy cells.

11. A method of operating a NAND nonvolatile memory device for verifying or reading a programmed state of a selected memory cell of a memory cell string including a plurality of memory cells, the operating method comprising:
applying one of a read voltage and a verify voltage to the selected memory cell;
applying a first pass voltage to non-selected memory cells closest to the selected memory cell;
applying one of a second and third pass voltage to non-selected memory cells second closest to the selected memory cell, the second and third pass voltage being greater than the first pass voltage; and
applying the third pass voltage to non-selected memory cells other than the closest or second closest non-selected memory cells, the third pass voltage greater than the first pass voltage but less than the second pass voltage,
wherein the first pass voltage satisfies $(V_{th}(\min)-V_{determine})/2\alpha > V'_{read} > V_{th}(\max) - \alpha V''_{read}$, where $V'_{read}$ is the first pass voltage, $V''_{read}$ is the second pass voltage, $V_{th}(\min)$ and $V_{th}(\max)$ are a minimum threshold voltage and a maximum threshold voltage of the programmed state of the selected memory cell respectively, the read or verify voltage is $V_{determine}$, $\Delta V_{th}$ is a change in a threshold voltage of the selected memory cell due to interference between a control gate and a channel, and $\alpha$ is $\Delta V_{th}/V'_{read}$.

12. The operating method of claim 11, wherein the selected memory cell is an end memory cell.

13. The operating method of claim 11, wherein the selected memory cell is a memory cell directly adjacent to an end memory cell.

14. The operating method of claim 8, wherein the selected memory cell is one of a floating gate memory cell and a charge trap memory cell.

15. The operating method of claim 8, wherein the non-selected memory cells are part of the memory cell string, and
outermost end memory cells on each end of the memory cell string are always non-selected dummy cells that do not store information.

16. The operating method of claim 8, wherein the non-selected memory cells are part of the memory cell string, and
two outermost end memory cells on each end of the memory cell string are always non-selected memory cells.

17. The operating method of claim 16, wherein the four outermost memory cells are dummy cells that do not store information.

18. The operating method of claim 11, wherein the selected memory cell is one of a floating gate memory cell and a charge trap memory cell.

19. The operating method of claim 11, wherein the non-selected memory cells are part of the memory cell string, and
outermost end memory cells on each end of the memory cell string are always non-selected dummy cells that do not store information.

20. The operating method of claim 11, wherein the non-selected memory cells are part of the memory cell string, and
two outermost end memory cells on each end of the memory cell string are always non-selected memory cells.

* * * * *